United States Patent
Okubo et al.

(10) Patent No.: US 10,261,411 B2
(45) Date of Patent: Apr. 16, 2019

(54) PELLICLE FILM, PELLICLE FRAME, PELLICLE, AND METHOD FOR PRODUCING SAME

(71) Applicant: MITSUI CHEMICALS, INC., Minato-ku, Tokyo (JP)

(72) Inventors: Atsushi Okubo, Tokyo (JP); Tsuneaki Biyajima, Otake (JP); Yosuke Ono, Sodegaura (JP); Kazuo Kohmura, Chiba (JP); Yasuhisa Fujii, Kyoto (JP); Nobuko Matsumoto, Kyoto (JP)

(73) Assignee: MITSUI CHEMICALS, INC., Minato-ku, Tokyo (JP)

( * ) Notice: Subject to any disclaimer, the term of this patent is extended or adjusted under 35 U.S.C. 154(b) by 27 days.

(21) Appl. No.: 15/629,085

(22) Filed: Jun. 21, 2017

(65) Prior Publication Data

US 2017/0285461 A1    Oct. 5, 2017

Related U.S. Application Data

(63) Continuation of application No. PCT/JP2016/051811, filed on Jan. 22, 2016.

(30) Foreign Application Priority Data

Feb. 24, 2015    (JP) ................................ 2015-034267
Oct. 30, 2015    (JP) ................................ 2015-214500

(51) Int. Cl.
| | |
|---|---|
| *G03F 1/62* | (2012.01) |
| *G03F 1/64* | (2012.01) |
| *G03F 1/66* | (2012.01) |
| *G03F 7/20* | (2006.01) |

(52) U.S. Cl.
CPC .............. *G03F 1/64* (2013.01); *G03F 1/62* (2013.01); *G03F 1/66* (2013.01); *G03F 7/2004* (2013.01); *G03F 7/70983* (2013.01)

(58) Field of Classification Search
CPC ..... G03F 1/62; G03F 1/64; G03F 1/66; G03F 7/2004; G03F 7/70983
USPC ........................................................... 430/5
See application file for complete search history.

(56) References Cited

U.S. PATENT DOCUMENTS

| | | |
|---|---|---|
| 5,422,704 A | 6/1995 | Sego |
| 6,475,575 B1 | 11/2002 | Ikuta et al. |
| 6,593,035 B1 | 7/2003 | Levinson et al. |
| 2004/0137339 A1 | 7/2004 | Zhang et al. |
| 2008/0213679 A1 | 9/2008 | Miyakawa et al. |
| 2016/0147141 A1 | 5/2016 | Ono et al. |

FOREIGN PATENT DOCUMENTS

| | | |
|---|---|---|
| EP | 2749945 A2 | 7/2014 |
| JP | 2001-147519 A | 5/2001 |
| JP | 2010-217698 A | 9/2010 |
| JP | 2013-004893 A | 1/2013 |
| WO | WO 2004/040374 A2 | 5/2004 |
| WO | WO 2008/105531 A1 | 9/2008 |
| WO | WO 2014/188710 A1 | 11/2014 |
| WO | WO 2015/182483 A1 | 12/2015 |

OTHER PUBLICATIONS

International Search Report (PCT/ISA/210) dated Apr. 19, 2016, by the Japanese Patent Office as the International Searching Authority for International Application No. PCT/JP2016/051811.
Written Opinion (PCT/ISA/237) dated Apr. 19, 2016, by the Japanese Patent Office as the International Searching Authority for International Application No. PCT/JP2016/051811.
Chkhalo et al.: "Free-standing spectral purity filters for extreme ultraviolet lithography," Journal of Microlithography, Microfabrication and Microsystems, vol. 11, No. 2, May 31, 2012, US-ISSN, 537-1646.

*Primary Examiner* — Christopher G Young
(74) *Attorney, Agent, or Firm* — Buchanan, Ingersoll & Rooney PC

(57) ABSTRACT

A pellicle is contaminated with dust or the like for various reasons during the production thereof. Especially, there is a problem that the risk that the dust or the like is attached is high during trimming or various other processes performed on a pellicle film. The present invention provides a method for producing a pellicle for EUV that decreases the attachment of dust or the like. A method for producing a pellicle includes forming a pellicle film on a substrate; trimming the substrate; and removing at least a part of the substrate after trimming the substrate. Before the part of the substrate is removed, at least particles attached to a surface of the pellicle film are removed.

9 Claims, 15 Drawing Sheets

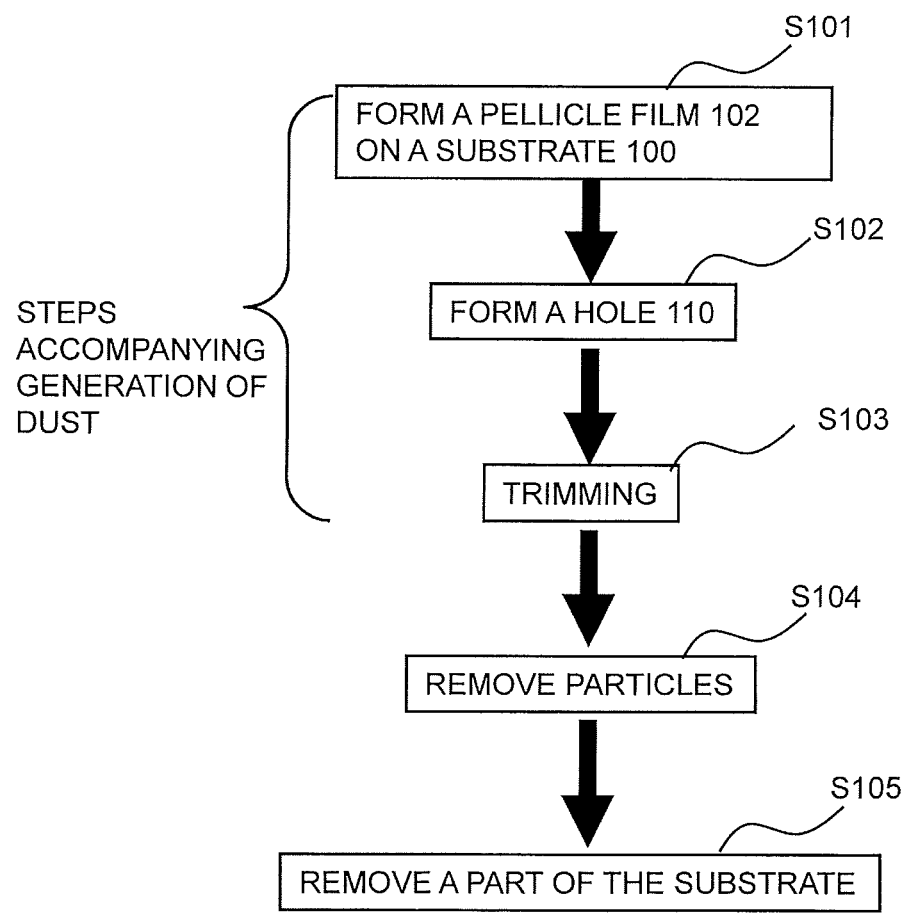

PELLICLE FILM, PELLICLE FRAME, PELLICLE, AND METHOD FOR PRODUCING SAME

CROSS REFERENCE TO RELATED APPLICATIONS

This application is based upon and claims the benefit of priority from the prior Japanese Patent Application No. 2015-034267 filed on Feb. 24, 2015 and the prior Japanese Patent Application No. 2015-214500 filed on Oct. 30, 2015, the entire contents of which are incorporated herein by reference.

FIELD

The present invention relates to a pellicle film, a pellicle frame, and a pellicle usable for a mask for photolithography, and a method for producing the same; and specifically to a pellicle film which is an extremely thin film for extreme ultraviolet lithography (EUV), a pellicle frame, a pellicle and a method for producing the same,

BACKGROUND

In a photolithography process, in order to prevent dust (particles) or the like from being attached to a mask or a reticle, a pellicle including a pellicle film extended along one end of a frame of a size appropriate to enclose a mask pattern is used.

The pellicle is originally used to protect a photomask against dust or the like. If a produced pellicle has dust or the like attached thereto, it is meaningless to use the pellicle. Therefore, a pellicle production method that decreases the amount of dust or the like attached to the pellicle is a technology currently strongly desired.

A pellicle, especially a pellicle for EUV, is obtained as follows as described in Japanese Laid-Open Patent Publication No. 2013-004893. A pellicle film is formed on a substrate such as a silicon substrate or the like by CVD, sputtering or any other appropriate film formation method, and then only the substrate is removed by etching or the like while a peripheral frame-like region is left (back-etching). Since etching is generally performed by an existing semiconductor production process, the substrate is processed in a state of being disc-shaped, namely, in a so-called wafer state. Therefore, in order to produce a pellicle film, the substrate for the pellicle film is removed by back-etching and then the pellicle film is trimmed. However, such a pellicle production method has a problem that particles generated at the time of trimming are accumulated on a surface of the film and thus contaminate the pellicle film.

SUMMARY

A pellicle may be contaminated with dust or the like for various reasons during the production thereof. Especially, there is a problem that the risk that the dust or the like is attached is high during trimming or various other processes performed on the pellicle film.

A conceivable method for preventing the contamination is to clean the completed pellicle film. However, a pellicle film for EUV, which is an extremely thin film, has a thickness of a nanometer order and thus is very easy to be broken. Another conceivable method for preventing the contamination is to perform the trimming by stealth dicing. However, even with trimming by stealth dicing, there occurs a phenomenon that particles are generated during expansion and are attached to the pellicle film. This does not fundamentally solve the problem.

The present invention has an object of providing a pellicle film for EUV, a pellicle frame, a pellicle and a method for producing the same that decrease the attachment of dust or the like.

Provided in order to solve the above-described problems is a method for producing a pellicle, including forming a pellicle film on a substrate; trimming the pellicle film; and removing at least a part of the substrate from the pellicle film after trimming the pellicle film.

Provided in order to solve the above-described problems is a method for producing a pellicle, including forming a pellicle film on a substrate; trimming the substrate; and removing at least a part of the substrate after trimming the substrate.

In an embodiment, the method for producing a pellicle may include removing at least particles attached to a surface of the pellicle film before removing the part of the substrate.

In an embodiment, the method for producing a pellicle may include chamfering an end portion of the substrate before removing the particles.

In an embodiment, the method for producing a pellicle may include forming a hole in at least the substrate before removing the particles.

In an embodiment, the method for producing a pellicle may include forming a hole in at least the pellicle film and the substrate before removing the particles.

In an embodiment, the method for producing a pellicle may include forming a hole in at least the pellicle film before removing the particles.

In an embodiment, the hole may be formed by use of an ultra-short pulse laser.

In an embodiment, the step of removing the part of the substrate is a wet etching step, and the hole may be formed by the wet etching step.

In an embodiment, the substrate may be trimmed by use of an ultra-short pulse laser.

Provided according to the present invention is a pellicle frame, including a pellicle film; and a first frame. The pellicle film is extended over the first frame; and the first frame includes at least one curved portion at an end portion thereof.

Provided according to the present invention is a pellicle frame, including a pellicle film; and a first frame. The pellicle film is extended over the first frame; the first frame includes inclining surface at an end portion thereof; and a top surface and the inclining surface of the first frame make an angle of 100 degrees to 170 degrees.

Provided according to the present invention is a pellicle in which a pellicle frame is connected with a second frame; and the second frame includes a curved portion at an end portion thereof.

According to the present invention, an "end portion" of the first frame refers to a side surface, an edge or a corner edge. Specifically, the "end portion" encompasses an edge made by two adjacent side surfaces of a substrate (in the case where the substrate is used as the first frame, the first frame), an edge made by a top surface (surface in contact with the pellicle film) and a side surface of the substrate, and a corner edge including a point at which the top surface and two adjacent side surfaces of the substrate cross each other.

With a pellicle frame, a pellicle, and a method for producing the same according to the present invention, the step of hole formation, trimming or the like that accompanies generation of dust is performed before a substrate below the pellicle film is removed. With such an arrangement, even if dust or the like is attached to the pellicle film by such a step that accompanies the generation of dust, the pellicle film may be cleaned before the substrate below the pellicle film is removed, so that the attachment of dust or the like to the finished pellicle film is minimized. Thus, a high quality pellicle is provided.

In an embodiment according to the present invention, R-chamfering or C-chamfering is performed before the substrate below the pellicle film is removed. In this manner, a pellicle frame and a pellicle that decrease the attachment of dust or the like (even after being produced) are provided.

BRIEF DESCRIPTION OF DRAWINGS

FIG. 1 is a flowchart showing a method for producing a pellicle frame and a pellicle in an embodiment;

DESCRIPTION OF EMBODIMENTS

Figure 2A:
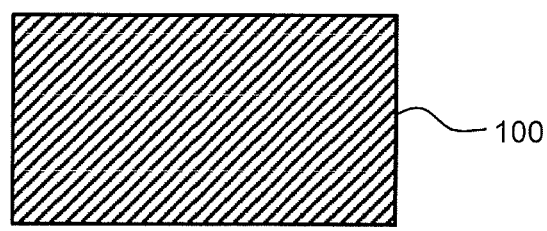
FIG. 2A provides schematic views showing the method for producing the pellicle frame and the pellicle in an embodiment and is a cross-sectional view of a substrate 100.
Figure 2B:
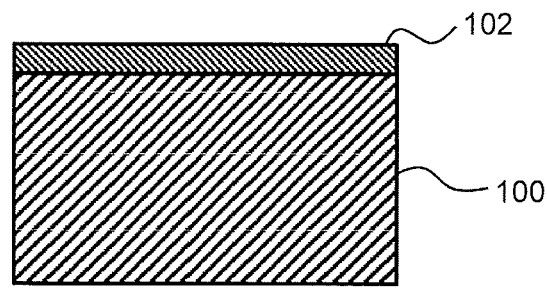
FIG. 2B provides schematic views showing the method for producing the pellicle frame and the pellicle in an embodiment and is a cross-sectional view of the substrate 100 and a pellicle film 102 stacked on the substrate 100.

Hereinafter, embodiments of the present invention will be described with reference to the drawings. The present invention may be carried out in various forms without departing from the gist thereof, and is not to be construed as being limited to any of the following embodiments. In the drawings, components may be shown schematically regarding the width, thickness, shape and the like, instead of being shown in accordance with the actual sizes, for the sake of clearer illustration. The schematic drawings are merely examples and do not limit the interpretations of the present invention in any way. In the specification and the drawings, components that have substantially the same functions as those described before with reference to a previous drawing(s) bear the identical reference signs thereto, and detailed descriptions thereof may be omitted.

In the specification and the claims, an expression that a component or area is above or below another component or area encompasses a case where such a component or area is in contact with the another component or area and also a case where such a component or area is above or below the another component or area, namely, a case where still another component or area is provided between such a component or area and the another component or area, unless otherwise specified.

In this specification, the "pellicle film" refers to a thin film used for a pellicle. The "pellicle frame" refers to an assembly of a pellicle film and a first frame that are connected with each other. The "pellicle" refers to an assembly of a pellicle frame and a second frame that are connected with each other.

"Trimming" refers to cutting a substrate, or an assembly of the substrate and the pellicle film formed on the substrate, in accordance with a desired pellicle shape. The shape of the pellicle is often rectangular. Therefore, in this specification, an example of cutting the substrate, or an assembly of the substrate and the pellicle film formed on the substrate, into a rectangular shape is shown as a specific example of trimming.

In this specification, "back-etching" refers to a step of removing a part of the substrate while the pellicle film is left. In this specification, etching of the substrate from a rear surface thereof (surface opposite to a surface on which the pellicle film is formed) is shown as an example of back-etching.

In this specification, "chamfering" is a concept encompassing R-chamfering and C-chamfering. "R-chamfering" refers to forming a curved portion by processing at least one end portion (side surface, edge, corner edge, etc.) of the substrate, the first frame (encompassing the first frame in a state where the substrate has been back-etched), or the second frame. "C-chamfering" refers to shaving the at least one end portion obliquely (not limited to shaving at an angle of 135 degrees).

(Embodiment 1)

An embodiment according to the present invention will be described with reference to FIG. 1 through FIG. 5F.

A pellicle to be produced by a pellicle production method according to the present invention is a pellicle for photolithography.

Figure 3A:
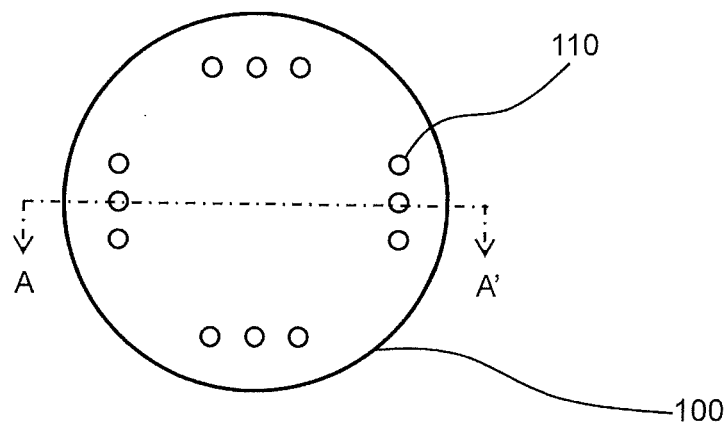
FIG. 3A provides schematic views showing the method for producing the pellicle frame and the pellicle in an embodiment and is a plan view.
Figure 3B:
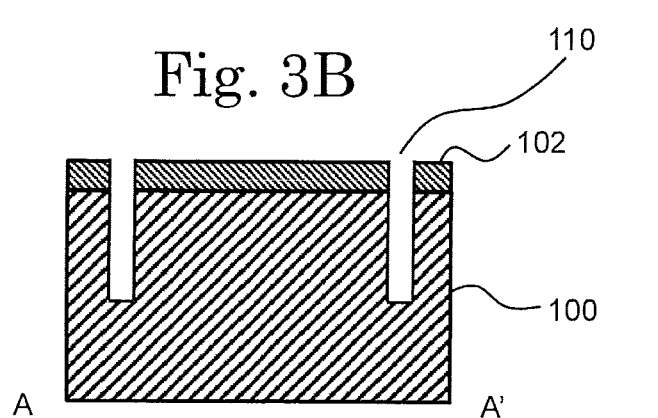
FIG. 3B provides schematic views showing the method for producing the pellicle frame and the pellicle in an embodiment and is a cross-sectional view taken along line A-A' in FIG. 3A FIG. 3C provides schematic views showing the method for producing the pellicle frame and the pellicle in an embodiment and is a cross-sectional view taken along line A-A' in FIG. 3A.
Figure 3C:
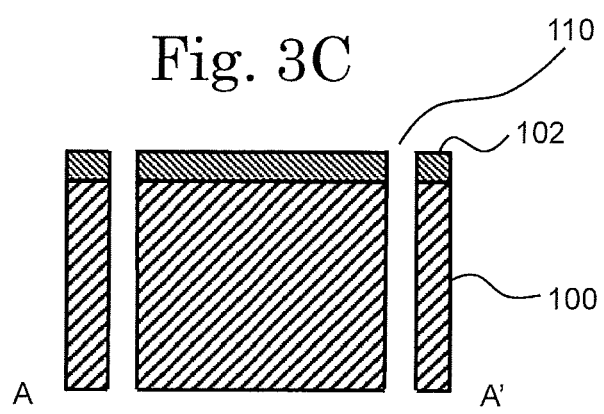

FIG. 1 is a flowchart showing a method for producing a pellicle in this embodiment. FIG. 2A is a cross-sectional view of a substrate. According to the present invention, as shown in FIG. 1, a pellicle film 100 is formed on a substrate 100 (e.g., silicon wafer) by CVD (Chemical Vapor Deposition) (e.g., LP-CVD film formation, PE-DVD film formation, etc.), sputtering film formation or the like (S101). In FIGS. 3A, 3B and 3C, the substrate is shown as being a perfect circle. The substrate is not limited to being a perfect circle and may have an orientation flat, a notch or the like formed therein. There is no specific limitation on the type of the substrate.

The pellicle film may be formed of polycrystalline silicon or the like. The material of the pellicle film is not limited to polycrystalline silicon. In the case where silicon-based materials are stacked to form the pellicle film, it is preferable to use a silicon wafer as the substrate from the point of view of ease of stacking.

From the point of view of transmission of EUV, the pellicle film has a thickness of about 10 nm or greater and about 100 nm or less, preferably, of a 20 nm or greater and 60 nm or less. The pellicle film does not need to be formed on the entirety of the substrate.

The pellicle film is not limited to being a single layer film, and may have a stack structure. For example, the pellicle film may have a stack structure including three layers, specifically, including a first silicon nitride layer, a polycrystalline silicon layer, and a second silicon nitride layer. In the case where the pellicle film has a stack structure including the three layers of the first silicon nitride layer, the polycrystalline silicon layer and the second silicon nitride layer, one of the silicon nitride layers may have a thickness of 1 nm or greater and 5 nm or less, the polycrystalline silicon layer may have a thickness of 30 nm or greater and 60 nm or less, and the other silicon nitride layer may have a thickness of 1 nm or greater and 5 nm or less. Preferably, one of the silicon nitride layers may have a thickness of 1.5 nm or greater and 3 nm or less, the polycrystalline silicon layer may have a thickness of 30 nm or greater and 50 nm or less, and the other silicon nitride layer may have a thickness of 1.5 nm or greater and 3 nm or less.

According to the present invention, as shown in FIGS. 3A, 3B and 3C, at least one hole 110 may be formed in the substrate 100 (S102). In FIGS. 3A, 3B and 3C, the holes 110 are formed in four directions of the substrate 100. FIG. 3A is a plan view, and FIG. 3B and FIG. 3C are each a cross-sectional view of the plan view in FIG. 3A taken along line A-A' in FIG. 3A. The holes 110 do not need to run throughout the substrate 100. As shown in FIG. 3B, one or more holes 110 may be formed in the pellicle film 102 formed on the substrate 100 (S102).

As shown in FIG. 3B, the holes do not need to run throughout the substrate. Needless to say, as shown in FIG. 3C, the holes may run throughout the substrate. As shown in FIG. 3B and FIG. 3C, the holes may be formed in the pellicle film and the substrate.

In the case where at least one hole is formed to run throughout the substrate and trimming is performed by etching in a later trimming step, and in the case where back-etching is performed, the hole may be once closed before the etching in order to protect the hole, or the hole may be protected by a resist.

There is no limitation on the size of the hole 110. In the case where, for example, the hole has a generally circular shape, the hole has a diameter of about 50 µm or greater and about 2000 µm or less. Preferably, the hole has a diameter of about 200 µm or greater and about 700 µm or less. There is no specific limitation on the shape of the hole 110. The hole 110 may be polygonal (e.g., generally quadrangular). In the case where the hole 110 is generally quadrangular, there is no limitation on the length of each of four sides. The length of a longer side may be 100 µm or greater and 3000 µm or less, and the length of a shorter side may be 50 µm or greater and 1000 µm or less. Preferably, the length of a longer side is 150 µm or greater and 2000 µm or less, and the length of a shorter side is 100 µm or greater and 700 µm or less.

Figure 4A:
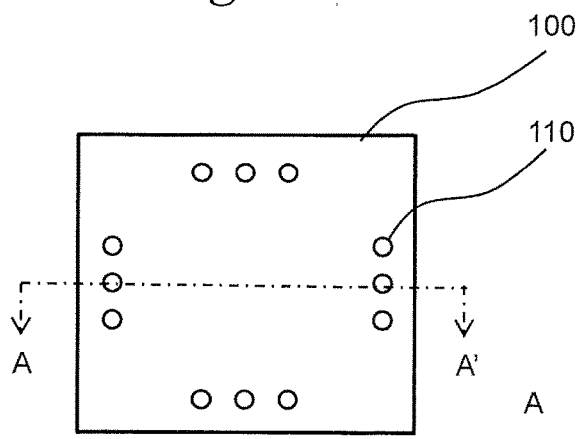
FIG. 4A provides schematic views showing the method for producing the pellicle frame and the pellicle in an embodiment and is a plan view.

As shown in FIG. 4A, the holes 110 may be located in peripheral regions of the pellicle. There is no limitation on the positions of the holes. The holes 110 may each be used as a jig hole usable to attach or demount the pellicle film to or from a photomask, or as a ventilation hole, but the holes are not indispensable for the pellicle.

The holes 110 are formed by use of an ultra-short pulse laser or any other type of laser, or by etching or the like. In the case where the holes 110 are formed by a laser, it is preferable to use an ultra-short pulse laser (e.g., picosecond laser or nanosecond laser), by which hole formation is performed with less debris, in order to form a high quality pellicle film with little dust or the like. It should be noted that the holes do not need to be formed in this step. Alternatively, the holes 110 may be formed by etching at the time of back-etching performed on the substrate as described below. In this manner, the production process may be simplified. In this case, after the trimming is performed, hole formation and etching are performed at the same time.

A nanosecond laser may be used under the following conditions: cycle oscillation frequency: 5 kHz or greater and 15 kHz or less; pulse energy: 5 W or greater and 15 W or less; scanning rate per second: 5 mm or greater and 30 mm or less; and number of times of scanning: 40 or greater and 300 or less. The conditions are not limited to the above.

In the case where an ultra-short pulse laser is used, a dross prevention agent for laser may be used. An example of dross prevention agent is a chemical such as CBX, which is a mixture of isopropyl alcohol (IPA) and micrographite. Such a chemical may be applied to the substrate before the holes are formed. The dross prevention agent is not limited to this. In the case where being used, a dross prevention agent is removed by cleaning after the holes are formed. According to another method for preventing attachment of dross, for example, helium gas may be blown to the substrate to be processed while the substrate is processed by a laser. Thus, the attachment of dross may be suppressed.

According to the present invention, the pellicle film is trimmed (S103).

According to the present invention, the substrate may be trimmed (S103), or the pellicle film formed on the substrate may be trimmed together with the substrate (S103). Only the substrate may be trimmed.

Figure 4B:
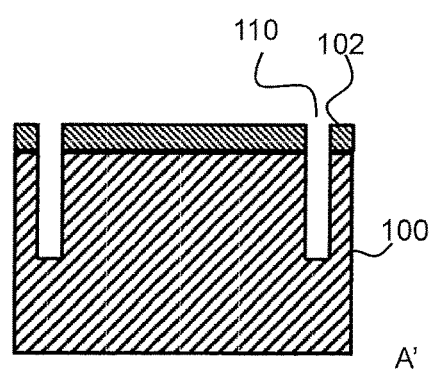
FIG. 4B provides schematic views showing the method for producing the pellicle frame and the pellicle in an embodiment and is a cross-sectional view taken along line A-A' in FIG. 4A.
Figure 4C:
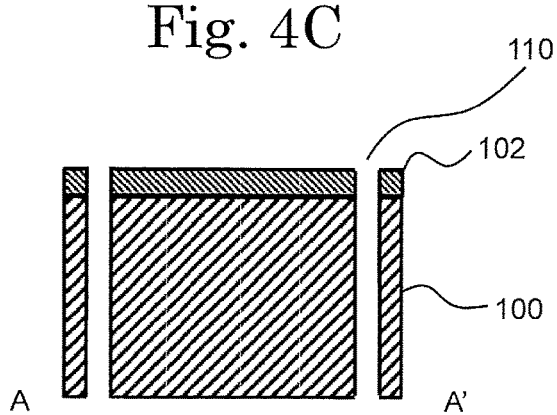
FIG. 4C provides schematic views showing the method for producing the pellicle frame and the pellicle in an embodiment; and is a cross-sectional view taken along line A-A' in FIG. 4A.

FIG. 4B is a schematic view of a post-trimming pellicle film having holes that do not run throughout the substrate. FIG. 4C is a schematic view of a post-trimming pellicle film having holes that run throughout the substrate. As a specific example of trimming, trimming performed to provide a rectangular shape is shown. The trimming may be performed to provide any shape. There is no limitation on the method of trimming. For example, the pellicle film and the substrate may be cut by application of a mechanical force. Alternatively, the trimming may be performed by laser cutting, laser half-cutting (stealth dicing), blade dicing, sand blasting, crystalline anisotropic etching, dry etching or the like. A technique that does not generate many foreign particles or much dust at the time of trimming is preferable. There is no limitation on the size or shape of the post-trimming substrate or pellicle film.

Figure 4D:
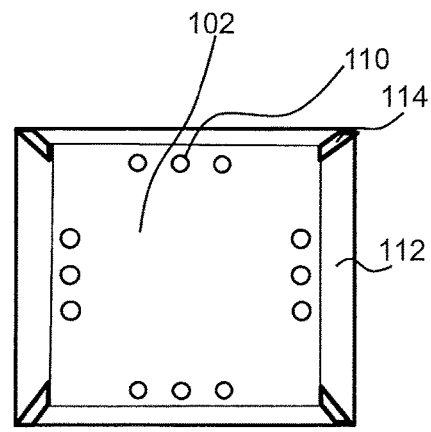
FIG. 4D provides schematic views showing the method for producing the pellicle frame and the pellicle in an embodiment and is a plan view.

According to a trimming method that does not generate much dust, a pressure-sensitive adhesive sheet 112, which is expandable and has the pressure-sensitive adhesiveness thereof decreased when being externally stimulated, is bonded to each of both surfaces of the substrate, and a bridge 114 is formed in a region of the substrate on which the pressure-sensitive adhesive sheet is bonded (FIG. 4D). Then, a cut is made in the bridge 114 for trimming.

In the above description, the trimming (S103) is performed after the holes are formed (S102). The order of the trimming and the hole formation may be opposite to the above, or any other step may be performed between the trimming and the hole formation, needless to say. In the case where a silicon wafer is used as the substrate, it may be desirable to perform the hole formation, the trimming and the etching in this order from the point of view of ease of processing.

According to the present invention, the step of forming the holes, trimming or the like that accompanies the generation of dust is performed before the substrate below the pellicle film is removed. With such an arrangement, even if particles such as dust or the like are attached to the pellicle film by such a step that accompanies the generation of dust, the particles may be removed by, for example, cleaning the pellicle film before the step of removing the substrate below the pellicle film. On this point, the method according to the present invention is significantly different from a conventional pellicle production method.

According to the present invention, the method may include a step of removing the particles (S104). Examples of method of removing the particles include wet cleaning, mechanical cleaning, dry cleaning, and the like. The method of removing the particles is not limited to any of the above.

Examples of the wet cleaning include cleaning with pure water and cleaning with an organic solvent. Examples of the wet cleaning also include cleaning with SPM (mixture of sulfuric acid and hydrogen peroxide), cleaning with buffered hydrofluoric acid (mixture of hydrofluoric acid and ammonium fluoride), cleaning with hydrofluoric acid, and the like. These types of cleaning may be combined and performed with any order.

Examples of the mechanical cleaning include brush cleaning, swing cleaning, ultrasonic cleaning, and cleaning with high-pressure atomization of aerosol such as argon or the like.

Examples of the dry cleaning include ash cleaning with $O_2$ plasma, argon sputtering, and the like.

According to the present invention, the method includes a step of removing a part of the substrate (S105). FIG. 5A through FIG. 5F provide schematic views of a pellicle film in a state where a part of the substrate has been removed. The substrate may be removed with a frame-shaped part thereof being left. In this case, a pellicle film for EUV, although being extremely thin film, is prevented from being broken because the pellicle is supported by the frame-shaped substrate.

The substrate may be removed by etching such as wet crystalline anisotropic etching, dry anisotropic etching, dry isotropic etching or the like. The substrate may be removed by etching or polishing. Alternatively, the etching or the polishing may be combined with a method of thinning the substrate (e.g., CMP polishing or the like).

In the case where the substrate is removed by etching, the at least one hole 110 may be formed in the etching step.

The step of thinning the substrate may be performed before the hole is formed or before the substrate is removed. Incorporation of this step into the method shortens the time required for the etching. When to perform this step is not specifically limited.

As shown in FIG. 5A through FIG. 5F, the substrate may be removed with a part thereof being left. The left part may be used as a first frame 116 of the pellicle film. There is no specific limitation on the shape of the part of the substrate to be left as the frame. In order to improve the strength, a relatively large area of the substrate may be left.

In order to leave a part of the substrate, a rear surface of a part of the substrate that is not to be removed is masked for patterning. The mask may be formed of any material that is usually used for etching, for example, silicon nitride. In the case where the hole is formed by etching, patterning is performed such that a part to be back-etched and also a part corresponding to the hole are exposed.

The etching may be performed in a state where the part of the substrate that is to be the frame has another frame attached thereto. Such attachment of another frame reinforces the first frame. Another frame may be, for example, a second frame 118 described below or a reinforcing frame different from the pellicle frame or the second frame.

After the trimming but before the etching, a protective film may be formed. The protective film is formed in order to prevent the pellicle film or the first frame from being contaminated or etched by the etching or laser processing step. In the case where the protective film is formed, ashing needs to be performed after the etching or laser processing step.

In the case where, for example, the step of thinning the substrate is incorporated, the physical strength of the substrate may be undesirably decreased temporarily. The use of the reinforcing frame prevents the substrate from being broken.

Figure 5A:
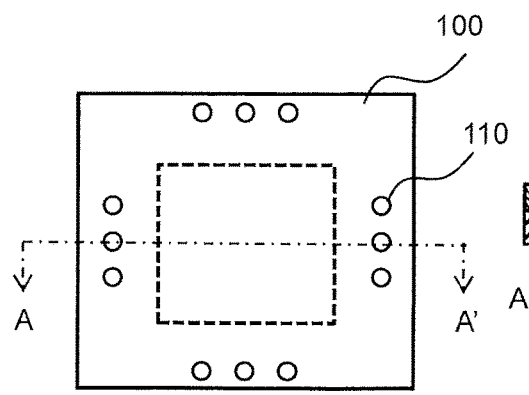
FIG. 5A provides schematic views showing the method for producing the pellicle frame and the pellicle in an embodiment and is a plan view.
Figure 5B:
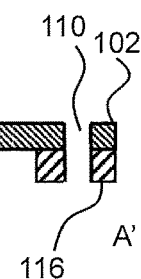
FIG. 5B provides schematic views showing the method for producing the pellicle frame and the pellicle in an embodiment and is a cross-sectional view taken along line A-A' in FIG. 5A.
Figure 5C:
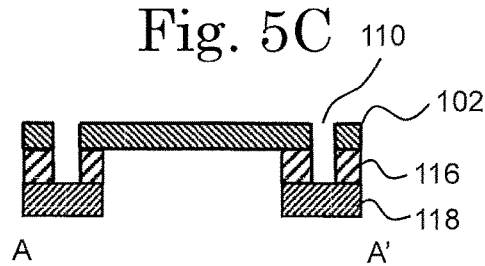
FIG. 5C provides schematic views showing the method for producing the pellicle frame and the pellicle in an embodiment and is a cross-sectional view taken along line A-A' in FIG. 5A.
Figure 5D:
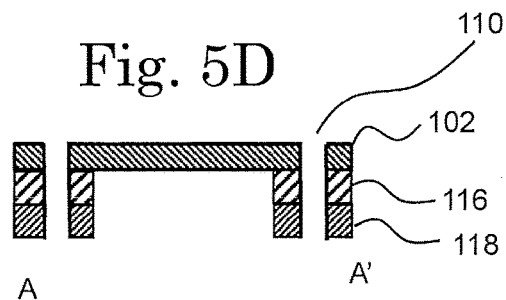
FIG. 5D provides schematic views showing the method for producing the pellicle frame and the pellicle in an embodiment and is a cross-sectional view taken along line A-A' in FIG. 5A.

The pellicle frame thus formed may be connected with the second frame 118 by an adhesive, a pressure-sensitive adhesive or the like (FIG. 5C and FIG. 5D). There is no specific limitation on the shape, size or material of the second frame to be connected. In the case where, for example, as shown in FIG. 5A through FIG. 5F, the pellicle film is trimmed to have a generally rectangular shape and the first frame 116 is formed by back-etching, the second frame having substantially the same shape as that of the first frame 116 may be separately formed and connected with the first frame 116. The pellicle for EUV is limited in the height thereof. It is preferable that the pellicle film and the frame have a total height of 2 mm or less. The second frame to be connected with the first frame 116 may have a jig hole as shown in FIG. 5D or may not have a jig hole as shown in FIG. 5C.

Figure 5E:
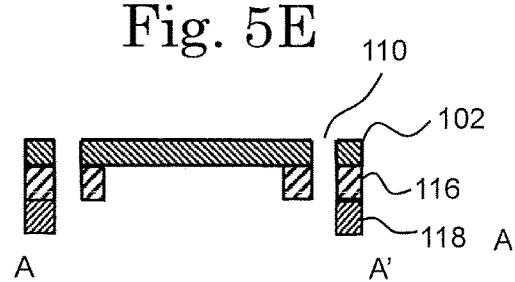
FIG. 5E provides schematic views showing the method for producing the pellicle frame and the pellicle in an embodiment and is a cross-sectional view taken along line A-A' in FIG. 5A.
Figure 5F:
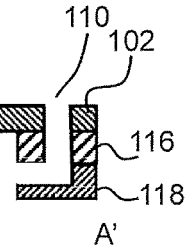
FIG. 5F provides schematic views showing the method for producing the pellicle frame and the pellicle in an embodiment and is a cross-sectional view taken along line A-A' in FIG. 5A.

A second frame having no through-hole may be connected as shown in FIG. 5E, or a second frame having a through-hole may be connected as shown in FIG. 5F. The through-hole in and FIG. 5F may act as a ventilation hole.

The first frame having the pellicle film formed thereon is used in an EUV laser environment. Therefore, the first frame may be formed of an aluminum alloy or the like used in a pellicle for an ArF laser. In order to decrease the thermal strain of the entirety of the pellicle, it is preferable to use a material containing at least one of silicon, sapphire and silicon carbide, which have a coefficient of linear thermal expansion close to that of the pellicle film. It is more preferable to use silicon.

The pellicle frame (assembly of the pellicle film and the first frame connected with each other) and the second frame may be connected with each other by a pin. More specifically, a pin hole may be formed at a corner, along a side or the like of the pellicle frame, and a pin hole may be formed at a position of the second frame that overlaps the pin hole of the pellicle frame, so that the pellicle frame and the second frame are connected with each other by a pin.

According to the method for producing a pellicle in this embodiment, the step of hole formation, trimming or the like that accompanies the generation of dust is performed before the substrate below the pellicle film is removed. With such an arrangement, even if dust or the like is attached to the pellicle film by such a step that accompanies the generation of dust, the pellicle film may be cleaned before the substrate below the pellicle film is removed, so that the attachment of dust or the like to the finished pellicle film is minimized. Thus, the production method provides a high quality pellicle film.

EXAMPLE 1

Figure 6:
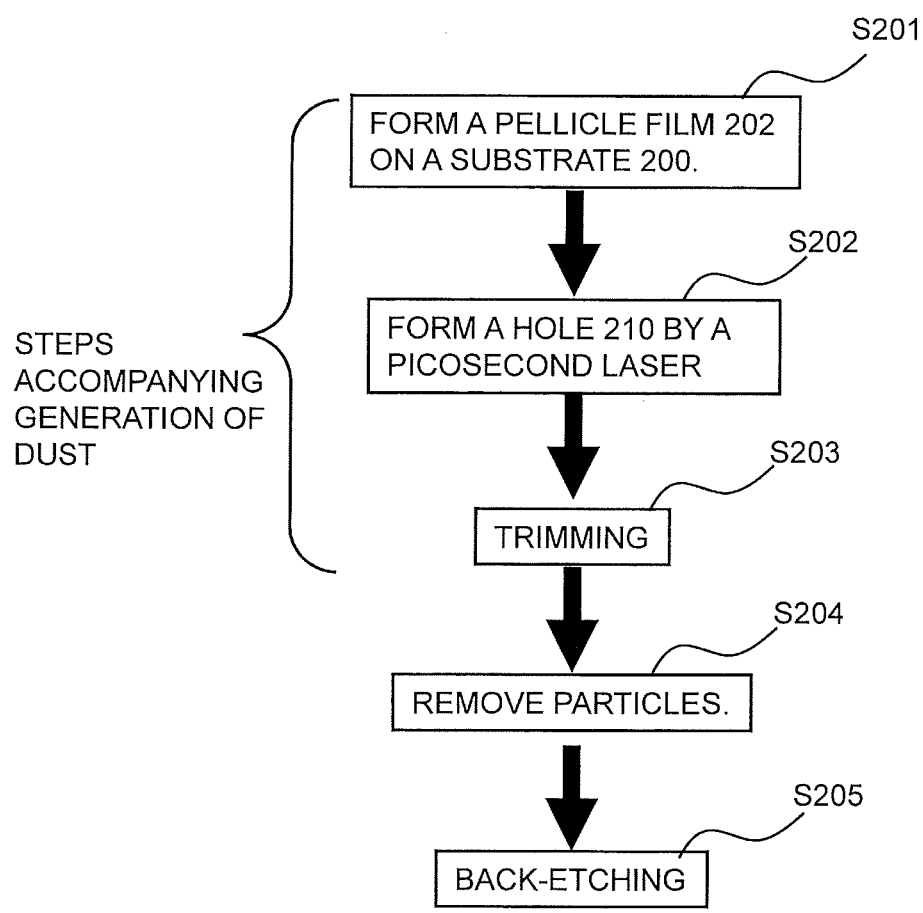
FIG. 6 is a flowchart showing a method for producing a pellicle frame and a pellicle in an embodiment.
Figure 7A:
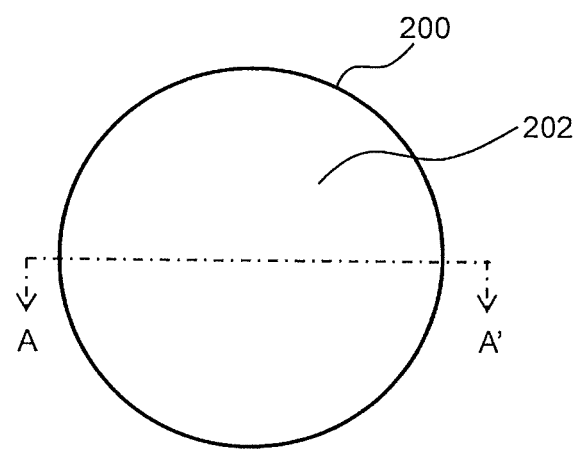
FIG. 7A provides schematic views showing the method for producing the pellicle frame and the pellicle in an embodiment and is a plan view.
Figure 7B:
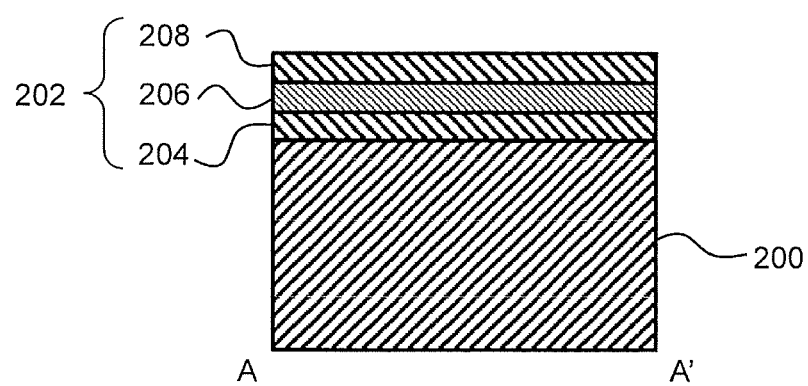
FIG. 7B provides schematic views showing the method for producing the pellicle frame and the pellicle in an embodiment and is a cross-sectional view taken along line A-A' in FIG. 7A.

FIG. 6 is a flowchart showing a method for producing a pellicle in example 1. FIGS. 7A and 7B provides schematic views showing a state where a pellicle film 202 is formed on a substrate 200. In this embodiment, on the silicon wafer 200 having a thickness of 725 µm and a diameter of 8 inches, a silicon nitride layer 204 was formed to a thickness of 5 nm by CVD (Chemical Vapor Deposition). On the silicon nitride layer 204, a polycrystalline silicon layer 206 was formed to a thickness of 60 nm. On the polycrystalline silicon layer 206, a silicon nitride layer 208 was formed to a thickness of 5 nm. Thus, the pellicle film 202 was formed (S201).

Figure 8A:
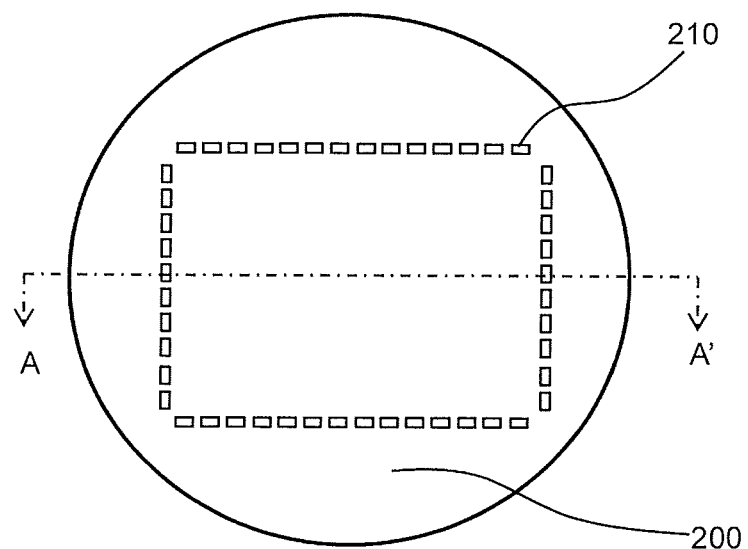
FIG. 8A provides schematic views showing the method for producing the pellicle frame and the pellicle in an embodiment and is a plan view.
Figure 8B:
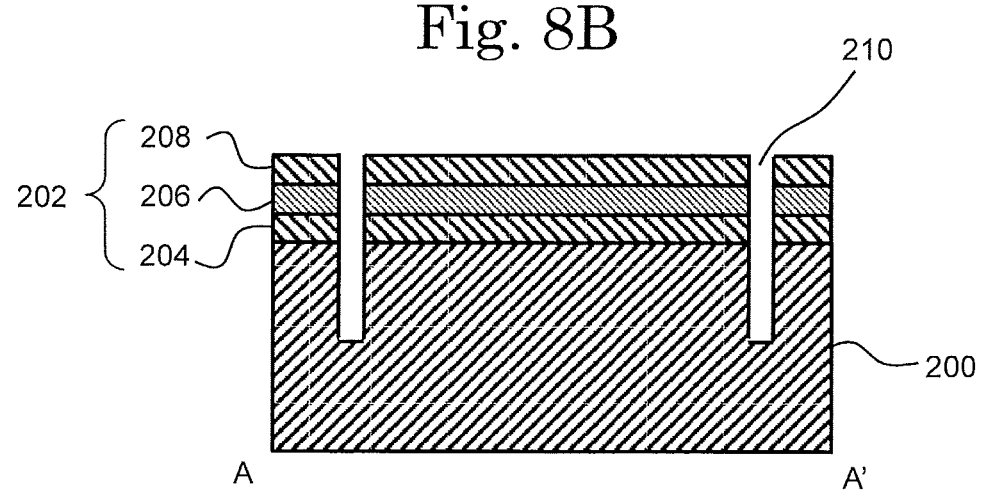
FIG. 8B provides schematic views showing the method for producing the pellicle frame and the pellicle in an embodiment and is a cross-sectional view taken along line A-A' in FIG. 8A.

In this example, next, 48 holes 210 in total were formed (S202). The holes 210 each had a generally rectangular shape having a length of a shorter side of 200 µm and a length of a longer side of 1500 µm. Fourteen such holes 210 were formed along each of the longer sides of the 8-inch wafer, and 10 such holes 210 were formed along each of the shorter sides of the 8-inch wafer and 10 (FIG. 8A)

In this example, the holes were formed by an ultra-short pulse laser of a nanosecond order (S202). The ultra-short pulse laser provides laser light having a pulse width of a picosecond or nanosecond order. Because of such an extremely short pulse width thereof, the ultra-short pulse laser processes the pellicle film while avoiding any inconvenience (e.g., generation of microcracks) with almost no thermal influence on the pellicle film.

In order to form the holes, first, a dross prevention agent for laser was applied to a surface of the pellicle film. As the dross prevention agent for laser, laser CBX (water-soluble quick-drying type; micrographite-containing IPA) produced by J International was used. After being applied, the laser CBX was dried.

After the CBX was dried, the holes were formed by use of a nanosecond laser. The nanosecond laser was nanosecond 2ω laser. The nanosecond 2ω laser was used as a device converting the wavelength of 1064 nm of light emitted by a YAG light source to provide nanosecond laser light having a half wavelength thereof, namely, nanosecond laser light having a wavelength of 532 nm. The nanosecond 2ω laser was used under the following conditions: cycle oscillation frequency: 10 kHz; pulse energy: 9 W; scanning rate per second: 20 mm; number of times of scanning: 200.

As shown in FIG. 8A, 48 holes were formed by the above-described hole formation method, and then the laser CBX was cleaned away.

Figure 9A:
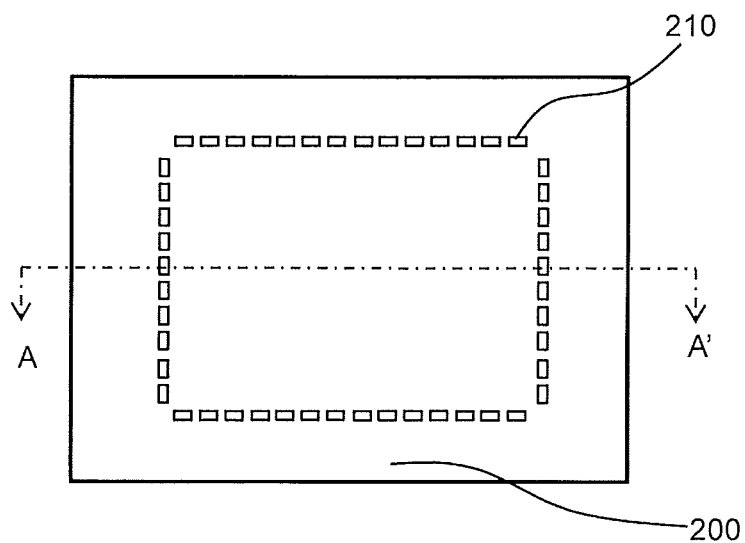
FIG. 9A provides schematic views showing the method for producing the pellicle frame and the pellicle in an embodiment and is a plan view.
Figure 9B:
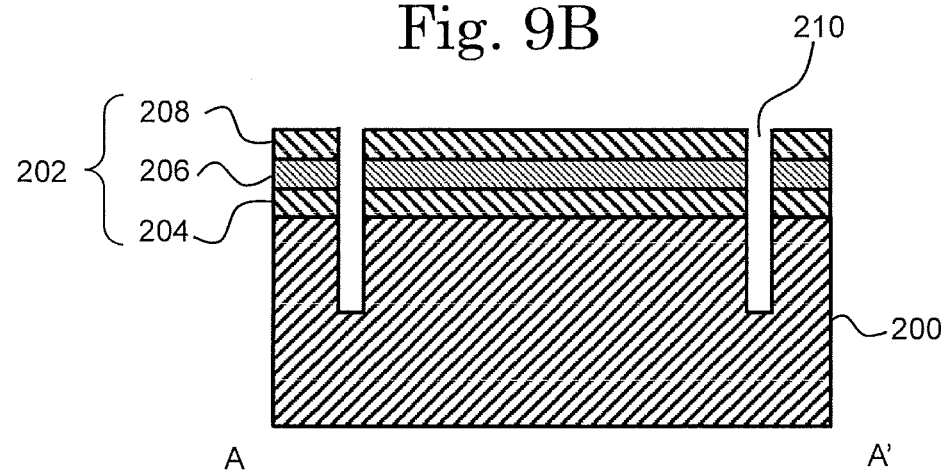
FIG. 9B provides schematic views showing the method for producing the pellicle frame and the pellicle in an embodiment and is a cross-sectional view taken along line A-A' in FIG. 9A.

The silicon wafer was trimmed to have a rectangular shape defined by a longer side having a length of 145.4 mm and a shorter side having a length of 112.6 mm by use of the nanosecond laser (S203). FIGS. 9A and 9B provide schematic views showing a post-trimming state.

After the trimming, the particles were cleaned by superpure water and removed (S204).

Figure 10A:
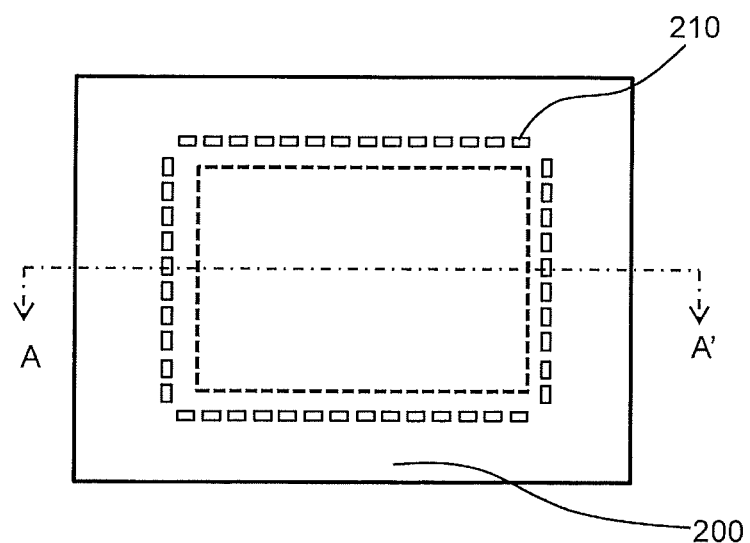
FIG. 10A provides schematic views showing the method for producing the pellicle frame and the pellicle in an embodiment and is a plan view.
Figure 10B:
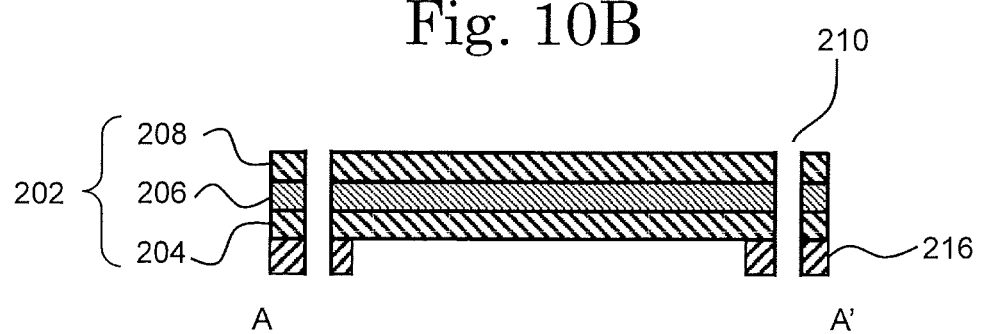
FIG. 10B provides schematic views showing the method for producing the pellicle frame and the pellicle in an embodiment and is a cross-sectional view taken along line A-A' in FIG. 10A.

After the particles were removed, the silicon wafer was removed from the pellicle film by back-etching (S205). In this step, the silicon wafer was not entirely removed, and a part thereof was left as a frame (FIGS. 10A and 10B).

With the method for producing a pellicle according to the present invention, all the steps accompanying the generation of dust such as the hole formation, the trimming and the like are finished before the particles are removed. With such an arrangement, the attachment of dust or the like to the finished pellicle is minimized, and thus the pellicle production method provides a high quality pellicle.

(Embodiment 2)

Figure 11:
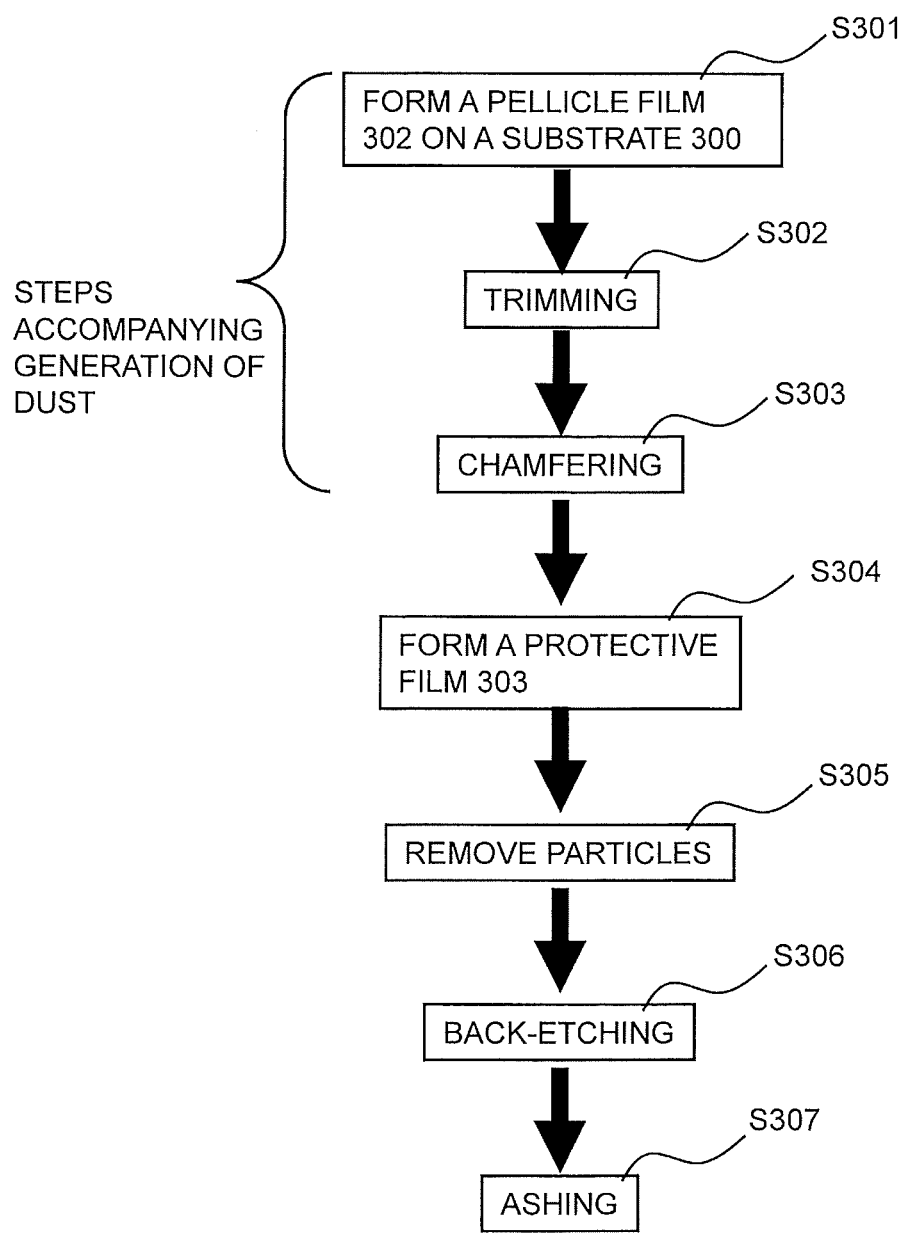
FIG. 11 is a flowchart showing a method for producing a pellicle frame and a pellicle in an embodiment.

With reference to FIG. 11, embodiment 2 will be described. In embodiment 2, a pellicle frame and a pellicle that do not easily generate particles after being produced (during transportation, at the time of handling, etc.) are produced. Regarding contents that are the same as those in embodiment 1, it will be so described, and detailed descriptions thereof will be omitted. In this embodiment, a pellicle film 302 is formed on a substrate 300 (S301). This step is substantially the same as in S101 in embodiment 1.

In this embodiment, a hole 310 (not shown) may be formed. This step is substantially the same as in S102 in embodiment 1. However, in FIG. 11, the substrate is removed by back-etching. Therefore, a step of removing the substrate by back-etching described below acts also as the step of forming the hole 310.

In this embodiment, the substrate is trimmed (S302). This step is substantially the same as in S103 in embodiment 1.

Figure 12A:
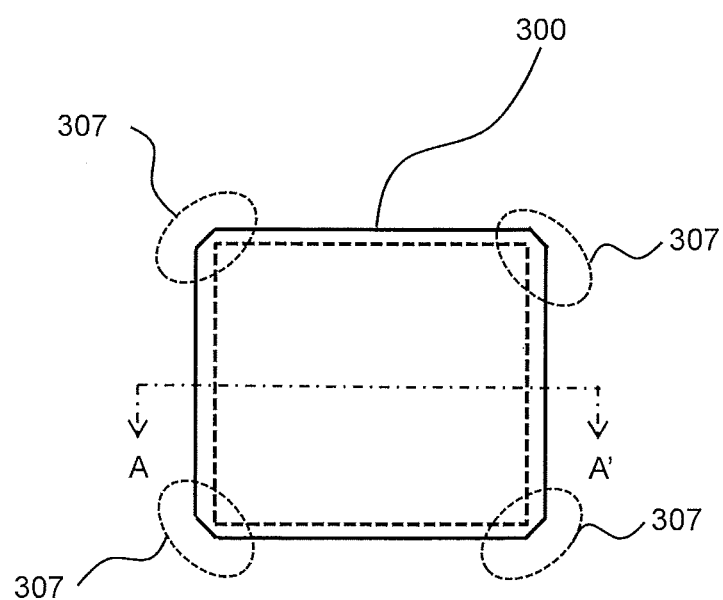
FIG. 12A provides schematic views showing the method for producing the pellicle frame and the pellicle in an embodiment and is a plan view.
Figure 12B:
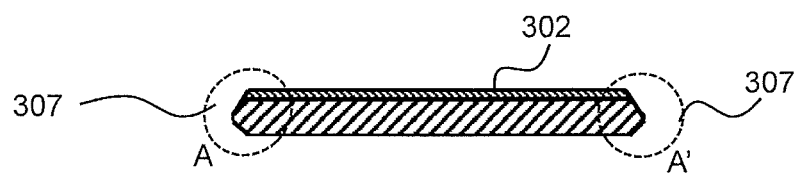
FIG. 12B provides schematic views showing the method for producing the pellicle frame and the pellicle in an embodiment and is a cross-sectional view taken along line A-A' in FIG. 12A.

According to the present invention, after the trimming is performed, a side surface is chamfered (S303). The "chamfering of the side surface" encompasses R-chamfering and C-chamfering as described above. FIGS. 12A and 12B show end portions to be chamfered (side surfaces, edges, corner edges, etc.). In FIGS. 12A and 12B, portions enclosed by dashed line 307 represent specific portions to be chamfered.

Referring to FIG. 12A, it is understood that the four corners as seen from above the pellicle film, enclosed by the dashed line, are C-chamfered. FIG. 12B is a cross-sectional view taken along line A-A' in FIG. 12A. Referring to FIG. 12B, it is understood that portions of sides of the substrate (outer peripheral regions), enclosed by the dashed line 307, are C-chamfered.

In the case where the C-chamfering is performed, inclining surfaces are formed at the end portions of the first frame (substrate). Angles made by a top surface of the first frame (surface in contact with the pellicle film) and the inclining surfaces at the end portions are each 100 degrees to 170 degrees, preferably, 120 degrees to 150 degrees. Angles made by a bottom surface of the first frame (surface opposite to the surface in contact with the pellicle film) and the inclining surfaces at the end portions are preferably 100 degrees to 170 degrees, more preferably 120 degrees to 150 degrees. It is preferable that an angle made by two adjacent side surfaces at each of edges is 100 degrees to 170 degrees.

In the case where the C-chamfering is performed, all the angles made by the top surface of the first frame and the inclining surfaces at the end portions do not need to be the same, and such angles may be in the range of 100 degrees to 170 degrees. The same is applicable to the angles made by the bottom surface of the first frame and the inclining surfaces at the end portions and also to the angles made by the two adjacent sides at the edges.

Figure 13A:
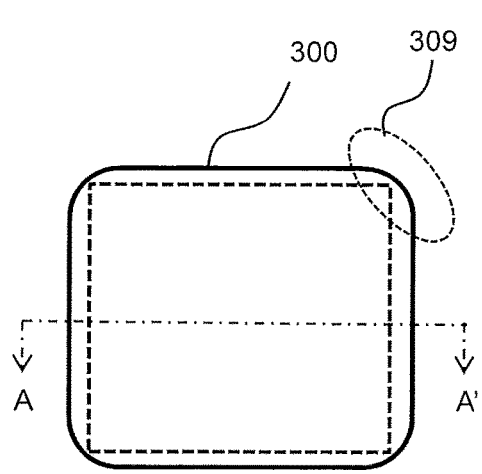
FIG. 13A provides schematic views showing a pellicle frame, a pellicle, and a method for producing the pellicle in an embodiment and is a plan view.
Figure 13B:
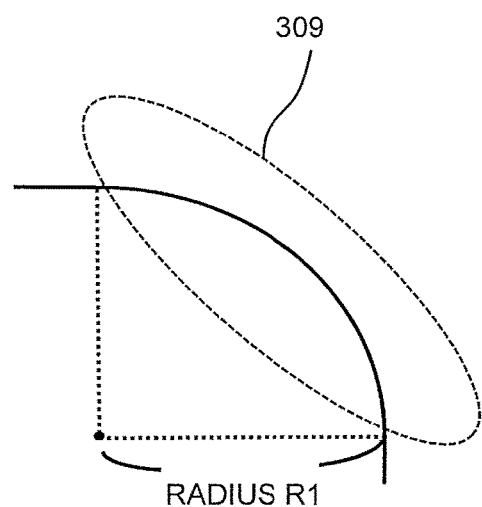
FIG. 13B provides schematic views showing a pellicle frame, a pellicle, and a method for producing the pellicle in an embodiment and is a partial enlarged view.
Figure 13C:
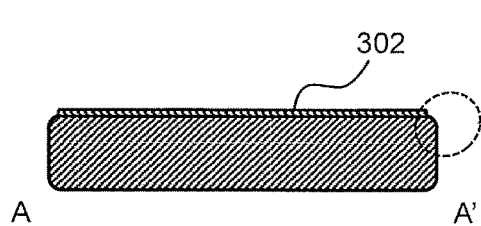
FIG. 13C provides schematic views showing a pellicle frame, a pellicle, and a method for producing the pellicle in an embodiment and is a cross-sectional view taken along line A-A' in FIG. 13A.
Figure 13D:
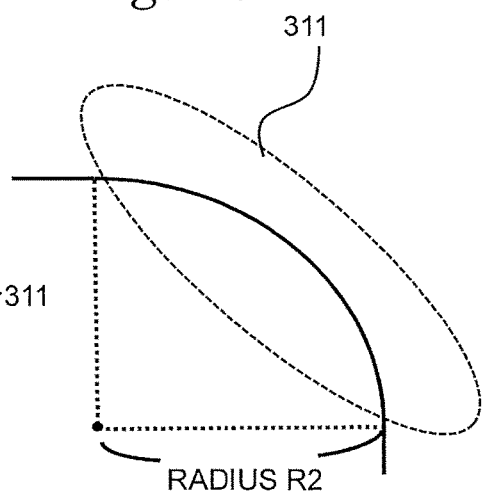
FIG. 13D provides schematic views showing a pellicle frame, a pellicle, and a method for producing the pellicle in an embodiment and is a partial enlarged view.

FIG. 13A shows R-chamfering. Referring to FIG. 13A, it is understood that the four corners as seen from above the pellicle film, one of which is enclosed by dashed line 309, are R-chamfered. FIG. 13B is an enlarged view of the portion enclosed by the dashed line 309, and defines radius R1 in this specification. FIG. 13C is a cross-sectional view taken along line A-A' in FIG. 13A. Referring to FIG. 13C, it is understood that the edge along the side of the substrate (outer peripheral region), enclosed by dashed line 311, is R-chamfered. FIG. 13D is an enlarged view of the portion enclosed by the dashed line 311, and defines radius R2 in this specification.

As shown in FIG. 13A and FIG. 13B, radius R1 is a radius of curvature of a curved portion at an edge made by two adjacent side surfaces of the substrate, and/or a curved portion at a corner edge including a point at which the top surface and two side surfaces of the substrate cross each other, and/or a curved portion at a corner edge including a point at which the bottom surface and two side surfaces of the substrate cross each other. According to the present invention, radius R1 is 5 μm to 10 mm, preferably, 5 μm to 4 mm.

As shown in FIG. 13C and FIG. 13D, radius R2 is a radius of curvature of a curved portion at an edge made by the top surface and a side surface of the substrate, and/or a curved portion at an edge made by the bottom surface and a side surface of the substrate. According to the present invention, radius R2 is 5 μm to 100 μm, preferably, 10 μm to 50 μm.

Figure 14A:
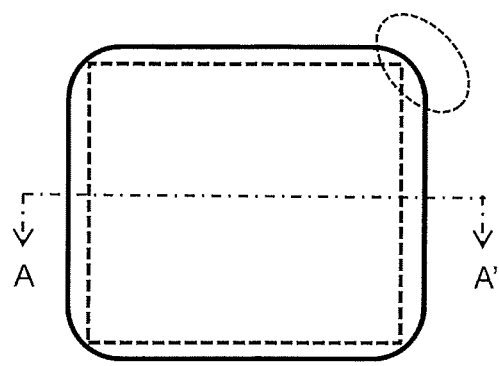
FIG. 14A provides schematic views showing a pellicle frame, a pellicle, and a method for producing the pellicle in an embodiment and is a plan view.
Figure 14B:
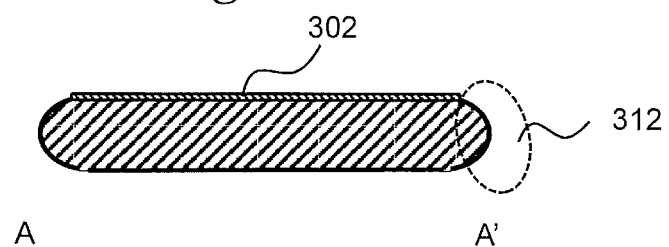
FIG. 14B provides schematic views showing a pellicle frame, a pellicle, and a method for producing the pellicle in an embodiment and is a cross-sectional view taken along line A-A' in FIG. 14A.
Figure 14C:
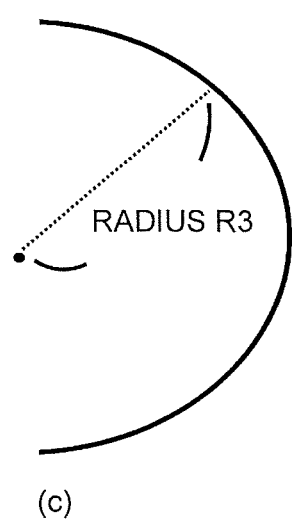
FIG. 14C provides schematic views showing a pellicle frame, a pellicle, and a method for producing the pellicle in an embodiment and is a partial enlarged view.

FIGS. 14A, 14B and 14C show R-chamfering different from that shown in FIG. 13A through 13D. FIG. 14A is substantially the same as FIG. 13A. It is understood that the four corners as seen from above the pellicle film, one of which is enclosed by the dashed line, is R-chamfered. FIG. 14B is a cross-sectional view taken along line A-A' in FIG. 14A. Referring to FIG. 14B, it is understood that a portion of a side surface (outer peripheral region) of the substrate, enclosed by dashed line 312, is R-chamfered in the entirety thereof. FIG. 14C is an enlarged view of the portion enclosed by the dashed line 312, and defines radius R3 in this specification.

As shown in FIG. 14A, FIG. 14B and FIG. 14C, radius R3 is a radius of curvature of a curved portion of a side surface of the substrate that is R-chamfered in the entirety thereof. According to the present invention, radius R3 is 100 μm to 500 μm, preferably, 200 μm to 400 μm.

Chamfering is performed in order to remove debris generated during the production (debris generated as a result of trimming, chips generated as a result of dicing, etc.) and also to remove pieced portions (acute angled portions) so that debris is not easily generated even if the pellicle collides against any component during transportation or at the time of handling after the production. From the point of view of removing the acute angled portions, the chamfering needs to be performed in the range of about 10 μm to about 3 mm.

R-chamfering may be performed by mechanical polishing such as diamond polishing or the like, excimer laser processing, wet etching, dry etching (by use of, for example, XeF$_2$, etc.) or the like. Mechanical polishing such as diamond polishing or the like is preferable from the point of view of ease of processing. C-chamfering may be performed by mechanical polishing such as diamond polishing or the like, excimer laser processing, wet etching, dry etching (by use of, for example, $XeF_2$, etc.) or the like. Among R-chamfering and C-chamfering, R-chamfering is preferable. A reason for this is that with C-chamfering, acute angled portions are left and cause generation of particles, whereas with R-chamfering, particles are not easily generated. Especially, a silicon wafer is harder than aluminum. Therefore, with C-chamfering, acute angled portions are left, and particles are easily generated by, for example, cracking of the acute angled portions. For substantially the same reasons, it is preferable that the pellicle, the first frame and the pellicle frame in a finished state have an R-chamfered shape including a curved portion, not a C-chamfered shape. A preferable value of radius of curvature of an R-chamfered shape having a curved portion is any of the above-described the preferable values of radii R1, R2 or R3 described above.

In this embodiment, after the trimming but before the etching, a protective film 303 may be formed (S304). The step of forming the protective film 303 needs to be performed before the etching. A reason for this is that the protective film is formed in order to prevent the pellicle film or the first frame from being contaminated or etched by the etching or laser processing step.

In this embodiment, cleaning is performed to remove the particles (S305) before the back-etching. The removal of the particles is the same as in S104. The substrate may be cleaned also before the formation of the protective film.

The protective film 303 may be formed of resist, fluorine-based polymer, paraxylene-based polymer (e.g., commercially available Parylene (registered trademark), etc.) or the like. Since ashing described below is performed after the back-etching, it is desirable to use paraxylene-based polymer, which is easy to be ashed. The protective film may be formed by applying or vapor-depositing such a material by CVD or the like.

Figure 15A:
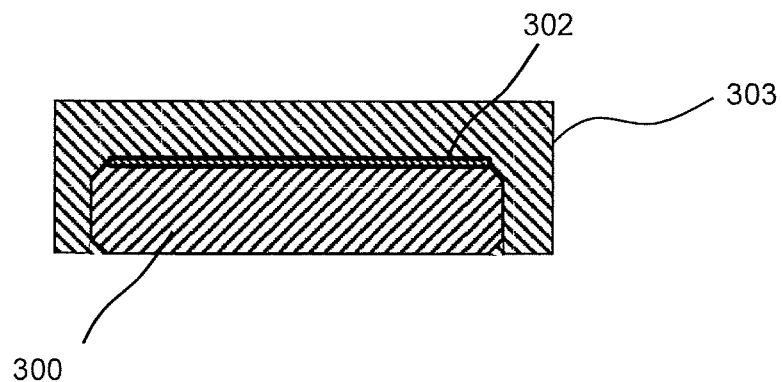
FIG. 15A provides schematic views showing a pellicle frame, a pellicle, and a method for producing the pellicle in an embodiment.

It is desirable to provide the protective film 303 on side surfaces in addition to the top surface (FIG. 15A). FIG. 15A shows a pellicle frame having the protective film formed thereon. It is preferable that the protective film 303 is not provided on the bottom surface of the substrate because if provided on the bottom surface, the protective film 303 is difficult to be removed by ashing described below. Therefore, it is preferable to cover the bottom surface of the substrate with a masking film (not shown) so that the protective film 303 is not formed thereon. The bottom surface of the substrate is masked for patterning, and thus the masking film is provided on the mask. After the protective film 303 is formed, the masking film is removed.

Figure 15B:
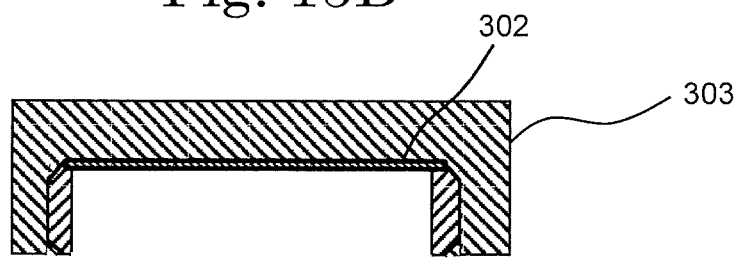
FIG. 15B provides schematic views showing a pellicle frame, a pellicle, and a method for producing the pellicle in an embodiment.

Next, the back-etching step is performed with an etchant (S306). FIG. 15B shows a state after the protective film 303 is formed and the back-etching has been performed (a central part of the substrate has been back-etched). Although not shown in FIG. 15B, a part of the substrate that corresponds to a through-hole such as a ventilation hole or the like may be dissolved to be removed, in addition to the central part of the substrate.

Figure 15C:
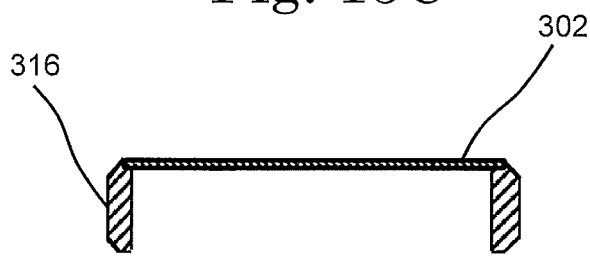
FIG. 15C provides schematic views showing a pellicle frame, a pellicle, and a method for producing the pellicle in an embodiment.

In the case where the protective film is formed, the protective film 303 is removed by ashing ($O_2$ plasma ashing, atmospheric pressure plasma ashing, etc.) after the back-etching (S307, FIG. 15C).

As in embodiment 1, a second frame may be connected with the first frame. The second frame may be formed of a metal material (e.g., anodized aluminum, etc.). The second frame may also be chamfered.

In this embodiment, the substrate of the pellicle (in the case where the substrate is used as the frame, the first frame) is chamfered before being back-etched. Therefore, a curved portion is formed at an end portion of the pellicle frame and the pellicle. With such a method, a pellicle frame and a pellicle that do not easily generate particles after the production thereof, for example, during transportation, at the time of demounting, or the like are produced. This will be described more specifically. The present inventors have found that a pellicle including a substrate having a pierced portion at the end portion after being produced generates particles from the pierced portion during transportation, at the time of handling, or the like. However, the pellicle film, which is thin, is difficult to be cleaned after being produced. Even if the pellicle is chamfered during the production thereof, the pressure applied at the time of R-chamfering or C-chamfering may undesirably break the pellicle film because the pellicle film is thin after the substrate below the pellicle film is removed. In addition, the R-chamfering or the C-chamfering usually accompanies generation of dust. Therefore, it is very undesirable to perform the R-chamfering or the C-chamfering after the substrate below the pellicle film is removed, in order to produce a high quality pellicle. By contrast, in an embodiment according to the present invention, the pellicle frame and the pellicle are R-chamfered or C-chamfered before the back-etching. Therefore, a high quality pellicle is provided.

If R-chamfering or C-chamfering is performed after the substrate below the pellicle film is removed, the pressure applied at the time thereof breaks the pellicle film because the pellicle film is thin. In addition, the R-chamfering or the C-chamfering usually accompanies generation of dust. Therefore, it is very undesirable to perform the R-chamfering or the C-chamfering after the substrate below the pellicle film is removed, in order to produce a high quality pellicle. The R-chamfered or C-chamfered pellicle frame and pellicle produced by the production method according to the present invention are only obtained by this production method.

EXAMPLE 2

Step 1: In this example, like in example 1, first, a pellicle film was formed on a silicon wafer used as a substrate (thickness of the substrate: 400 μm) by CVD.

Step 2: Next, a silicon nitride film (thickness: 400 nm) was formed on a rear surface of the silicon wafer (hereinafter, a surface of the substrate opposite to the surface on which the pellicle film was formed will be referred to as a "rear surface") (hereinafter, this silicon nitride film will be referred to as a "process film").

Step 3: Patterning was performed with a resist on the process film to expose a part thereof that was to be back-etched (i.e., part corresponding to a central part and the vicinity thereof of the substrate) and a part thereof in which a ventilation hole was to be formed.

Step 4: The silicon wafer was cut by dicing into a rectangular shape having a size corresponding to the pellicle to be produced (trimming step; in this example, cut into a rectangular shape having a length of a longer side of 150 mm and a length of a shorter side of 120 mm).

Step 5: In order to remove chips generated as a result of the dicing, a circumference of the resultant rectangular shape was removed by 0.1 mm by use of roll-polishing (chamfering step). In order to remove an edge, the resultant rectangular shape was polished by roll-polishing such that a curved portion having a radius of curvature of 30 μM would be obtained (chamfering step).

Step 6: A Parylene film was formed as a protective film on the pellicle film.

Step 7: The silicon wafer having the pellicle film, the process film and the protective film formed thereon was cleaned with super-pure water by wet cleaning.

Step 8: The silicon wafer was partially removed with an etchant (TMAH (tetramethylammonium hydroxide)). The part of the silicon wafer that was to be back-etched (i.e., central part of the substrate) and the part of the silicon wafer in which a ventilation hole was to be formed were dissolved and removed in accordance with the pattern formed by the patterning in step 3.

Step 9: The protective film (Parylene) was removed by ashing ($O_2$ ashing).

As a result, a pellicle with a ventilation hole that had no acute angled portion at the circumference thereof and had generation of foreign substance suppressed was obtained.

In this example, the pellicle was R-chamfered before being back-etched. Therefore, a curved portion was formed at an end portion of the pellicle frame and the pellicle. Thus, the pellicle frame and the pellicle that were of high quality and would not easily generate particles after the production thereof (during transportation, at the time of demounting, etc.) were produced. If R-chamfering or C-chamfering is performed after the substrate below the pellicle film is removed, the pressure applied at the time thereof breaks the pellicle film because the pellicle film is thin. In addition, the R-chamfering or the C-chamfering usually accompanies generation of dust. Therefore, it is very undesirable to perform the R-chamfering or the C-chamfering after the substrate below the pellicle film is removed, in order to produce a high quality pellicle.

EXAMPLE 3

Example 3 is the same as example 2 except for step 5 (steps 1 through 4 and 6 through 9 are the same as in example 2). In example 3, in step 5, a side surface was roll-polished by a polishing roll provided with a recessed portion having a radius of curvature of 1 mm.

In this example, the pellicle was R-chamfered before being back-etched. Therefore, a curved portion was formed at an end portion of the pellicle frame and the pellicle. Thus, the pellicle frame and the pellicle that were of high quality and would not easily generate particles after the production thereof (during transportation, at the time of demounting, etc.) were produced.

EXAMPLE 4

Example 4 is the same as example 2 except for steps 3, 6 and 8 (steps 1, 2, 4, 5, 7 and 9 are the same as in example 2). In this example, in step 3, a ventilation hole running throughout the assembly of the silicon wafer, the pellicle film and the process film was formed by a nanosecond pulse laser (YAG High Frequency Wave laser). Then, patterning was performed on the process film provided on the rear surface of the silicon wafer to expose a part thereof that was to be back-etched.

In this example, in step 6, a Parylene film was formed as a protective film on the pellicle film and in an inner surface of the ventilation hole.

In this example, in step 8, the substrate was partially removed with an etchant (TMAH). The central part of the substrate (part to be back-etched) was dissolved and removed in accordance with the pattern formed by the patterning in step 3.

In this example, the pellicle was R-chamfered before being back-etched. Therefore, a curved portion was formed at an end portion of the pellicle frame and the pellicle. Thus, the pellicle frame and the pellicle that were of high quality and would not easily generate particles after the production thereof (during transportation, at the time of demounting, etc.) were produced.

A method for producing a pellicle film in a preferable embodiment according to the present invention is described above. The above description is merely an example, and the technological scope of the present invention is not limited to the above. A person of ordinary skill in the art would make various modifications without departing from the gist of the present invention defined in the claims. These modifications should be construed as being encompassed in the technological scope of the present invention.

REFERENCE SIGNS LIST

100: Substrate
102: Pellicle film
110: Hole
112: Pressure-sensitive adhesive sheet
114: Bridge
116: First frame
118: Second frame
200: Substrate
202: Pellicle film
204, 208: Silicon nitride layer
206: Polycrystalline silicon layer
210: Hole
300: Substrate
302: Pellicle film
303: Protective film
316: First frame

The invention claimed is:

1. A method for producing a pellicle, comprising:
   forming a pellicle film on a substrate;
   trimming the substrate;
   removing at least particles attached to a surface of the pellicle film after trimming the substrate; and
   removing at least a part of the substrate after removing the particles.

2. The method for producing a pellicle according to claim 1, further comprising:
   chamfering an end portion of the substrate before removing the particles.

3. The method for producing a pellicle according to claim 1, wherein the step of removing at least the part of the substrate is a wet etching step.

4. The method for producing a pellicle according to claim 2, further comprising forming a hole in at least the substrate before removing the particles.

5. The method for producing a pellicle according to claim 2, further comprising forming a hole in at least the pellicle film and the substrate before removing the particles.

6. The method for producing a pellicle according to claim 4, wherein the hole is formed by use of an ultra-short pulse laser.

7. The method for producing a pellicle according to claim 5, wherein the hole is formed by use of an ultra-short pulse laser.

8. The method for producing a pellicle according to claim 3, wherein a hole is formed by the wet etching step.

9. The method for producing a pellicle according to claim 1, wherein the substrate is trimmed by use of an ultra-short pulse laser.

* * * * *